(12) United States Patent
Watanabe

(10) Patent No.: US 8,448,829 B2
(45) Date of Patent: May 28, 2013

(54) CASING ATTACHMENT STRUCTURE

(75) Inventor: Takato Watanabe, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 13/175,885

(22) Filed: Jul. 4, 2011

(65) Prior Publication Data
US 2012/0007379 A1    Jan. 12, 2012

(30) Foreign Application Priority Data

Jul. 12, 2010  (JP) .................................. 2010-157873

(51) Int. Cl.
*B60R 7/00* (2006.01)
*B60R 9/00* (2006.01)
*A47B 96/00* (2006.01)
*A47K 1/00* (2006.01)

(52) U.S. Cl.
USPC .. 224/547; 224/545; 248/224.61; 248/224.51

(58) Field of Classification Search
USPC ..... 224/547, 545, 546, 271, 272; 248/224.61, 248/224.51, 200, 298.1, 244, 292.12, 307
See application file for complete search history.

(56) References Cited

U.S. PATENT DOCUMENTS

| | | | | |
|---|---|---|---|---|
| 2,696,962 | A * | 12/1954 | Goss .............................. | 248/477 |
| 4,929,973 | A * | 5/1990 | Nakatani ..................... | 248/177.1 |
| 5,035,389 | A * | 7/1991 | Wang ....................... | 248/224.51 |
| 5,040,712 | A * | 8/1991 | Pesonen et al. ................ | 224/547 |
| 5,129,613 | A * | 7/1992 | Lloyd et al. .............. | 248/222.11 |
| 5,282,554 | A * | 2/1994 | Thomas ......................... | 224/421 |
| 5,332,183 | A * | 7/1994 | Kagayama ............... | 248/222.13 |
| 5,356,105 | A * | 10/1994 | Andrews .................. | 248/221.11 |
| 5,653,366 | A * | 8/1997 | Liserre ........................... | 224/539 |
| 5,730,348 | A * | 3/1998 | Tien .............................. | 224/669 |
| 5,730,406 | A * | 3/1998 | Chen ....................... | 248/223.41 |
| 6,036,071 | A * | 3/2000 | Hartmann et al. ............ | 224/547 |
| 6,315,182 | B1 * | 11/2001 | Chen .............................. | 224/420 |
| 7,225,958 | B2 * | 6/2007 | Hansen ........................ | 224/547 |
| 8,020,821 | B2 * | 9/2011 | Chen et al. ............... | 248/220.22 |

FOREIGN PATENT DOCUMENTS

| | | |
|---|---|---|
| JP | 03-104506 | 5/1991 |
| JP | 05-034306 | 2/1993 |
| JP | 08-222319 | 8/1996 |

(Continued)

OTHER PUBLICATIONS

Japanese Decision to Grant a patent for corresponding JP Application No. 2010-157873, Apr. 13, 2012.

*Primary Examiner* — Justin Larson
*Assistant Examiner* — Lester L Vanterpool
(74) *Attorney, Agent, or Firm* — Ditthavong Mori & Steiner, P.C.

(57) ABSTRACT

A receiving member is provided on a face of a casing and includes an insertion port and first and second abutment portions. An insertion portion of each of the brackets is inserted through the insertion port. The insertion port is shaped to have at least one step varying in a width of the insertion port such that the width is narrower as the at least one step is farther away from the face of the casing. Each of the first and second abutment portions has such an inner shape that, when the insertion portion is inserted through the insertion port, the abutment portion abuts against the leading end of the insertion portion in the insertion direction to restrict a movement of the leading end in association with the corresponding one of different widths of the insertion portions.

5 Claims, 12 Drawing Sheets

FOREIGN PATENT DOCUMENTS

| | | |
|---|---|---|
| JP | 09-139587 | 5/1997 |
| JP | 09-208021 | 8/1997 |
| JP | 09-324806 | 12/1997 |
| JP | 2001-354026 | 12/2001 |
| JP | 2002-316594 | 10/2002 |
| JP | 2002-329558 | 11/2002 |
| JP | 2008-308106 | 12/2008 |

\* cited by examiner

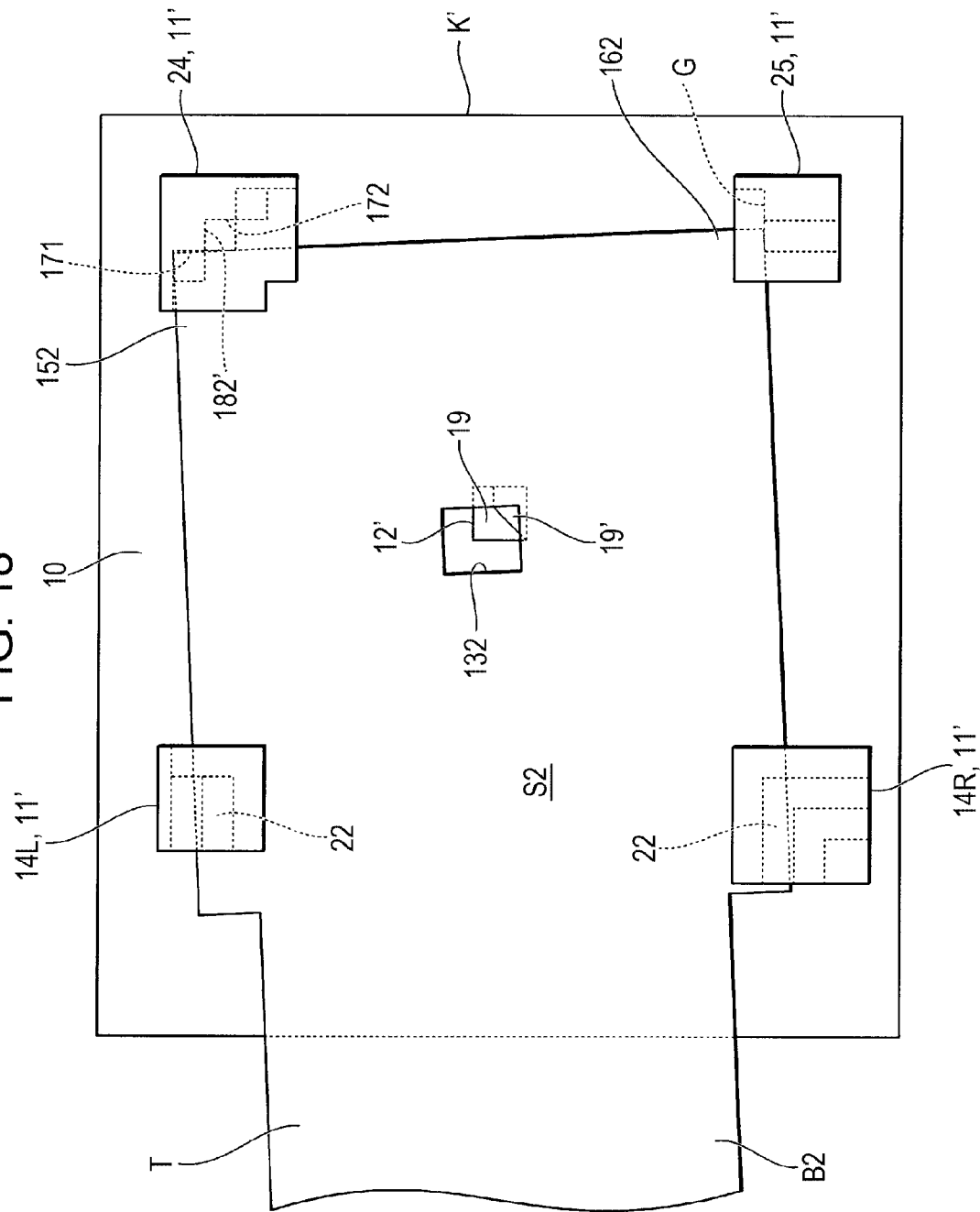

CASING ATTACHMENT STRUCTURE

CROSS-REFERENCE TO RELATED APPLICATIONS

The present application claims priority under 35 U.S.C. §119 to Japanese Patent Application No. 2010-157873, filed Jul. 12, 2010, entitled "CASING ATTACHMENT STRUCTURE". The contents of this application are incorporated herein by reference in their entirety.

BACKGROUND OF THE INVENTION

1. Field of the Invention

The present invention relates to a casing attachment structure.

2. Description of the Related Art

Structures for attaching a casing for an electronic device for a vehicle include, for example, a structure in which an attachment fitting is fixed to an instrument panel in a vehicle interior and a casing for a type of electronic device is attached to the attachment fitting without screws. The attachment fitting includes slide rails. While the slide rails are fitted into guide grooves provided for the casing, the casing is inserted into the attachment fitting along the slide rails. When a lock projection of a lock lever provided for the attachment fitting is fitted into a lock recess provided for one of the guide grooves, the lock lever is swung, so that the casing is received and secured to the attachment fitting while the lock lever is spring-urged (see, for example, Japanese Unexamined Patent Application Publication No. 2002-316594).

SUMMARY OF THE INVENTION

According to one aspect of the present invention, a casing attachment structure includes a casing having at least one attachment face and brackets to mount the casing to a body. Each of the brackets includes an attachment portion to be attached to the body and a rectangular plate-shaped insertion portion. The casing includes a receiving member and a fastening portion. The receiving member is provided on the at least one attachment face and the insertion portion of each of the brackets is inserted along the at least one attachment face. The fastening portion fastens the insertion portion to the at least one attachment face of the casing. The insertion portion of each of the brackets includes a fastening receiving portion to be engaged with the fastening portion of the casing to fasten the insertion portion to the receiving member of the casing. The receiving member of the casing includes an insertion port and first and second abutment portions. The insertion portion of each of the brackets enters the insertion port. The insertion port is shaped to have at least one step varying in a width of the insertion port such that the width is narrower as the at least one step is farther away from the at least one attachment face of the casing. Two corners of a leading end of the insertion portion in an insertion direction abut against the first and second abutment portions upon insertion of the insertion portion. Each of the first and second abutment portions has such an inner shape that, when the insertion portion is inserted through the insertion port, the abutment portion abuts against the leading end of the insertion portion in the insertion direction to restrict a movement of the leading end in association with the corresponding one of different widths of the insertion portions and the corresponding one of different distances each of which is between the fastening receiving portion and the leading end of the insertion portion. When the insertion portion of each of the brackets is inserted through the insertion port of the casing, the fastening receiving portion is engaged with the fastening portion of the casing only while the leading end of the insertion portion in the insertion direction abuts against the abutment portions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 18 is a plan view of the structure according to the second embodiment in a state where the bracket is partly inserted.

DESCRIPTION OF THE EMBODIMENTS

Figure 1:
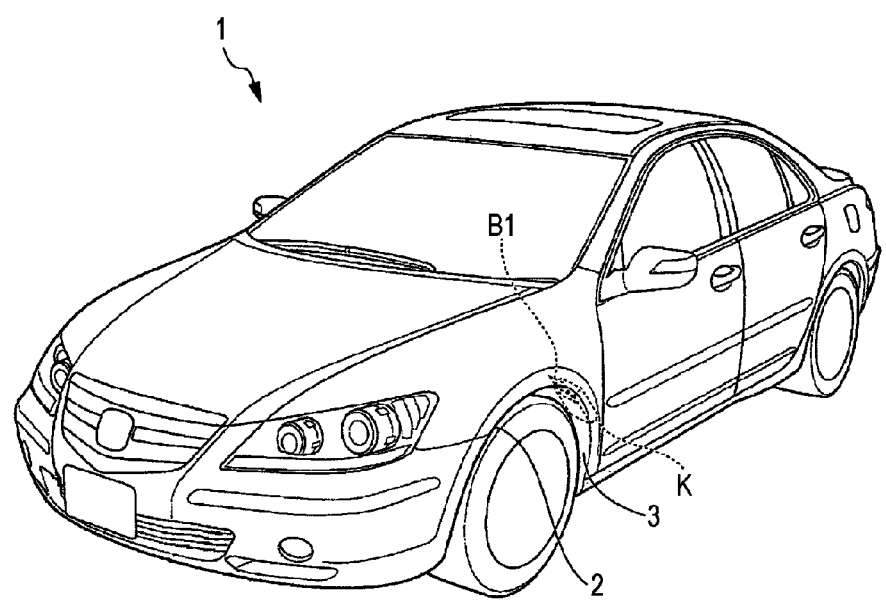
FIG. 1 is a perspective view of a vehicle in an embodiment of the present invention.

The embodiments will now be described with reference to the accompanying drawings, wherein like reference numerals designate corresponding or identical elements throughout the various drawings. A first embodiment of the present invention will be described below with reference to the drawings.

Figure 2:
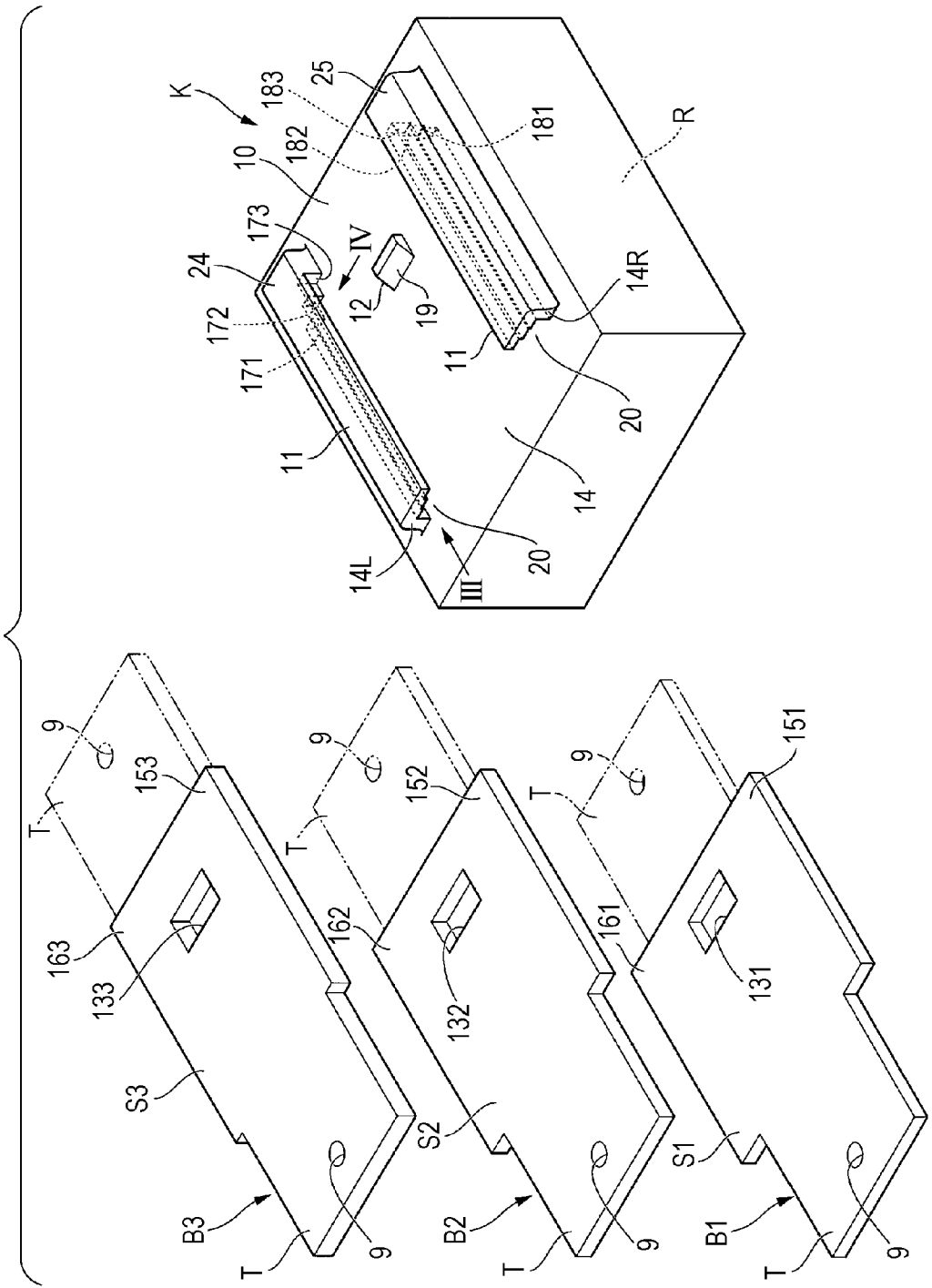
FIG. 2 is a schematic perspective view of a casing attachment structure according to a first embodiment of the present embodiment.

Referring to FIGS. 1 and 2, a casing K for receiving an electronic device is attached through a bracket B1 to the rear face of a rear wall 3 of a front wheel house 2 of a vehicle 1.

As schematically illustrated in FIG. 2, the casing K includes a receiving portion R which receives the electronic device (not illustrated). As regards the casing K, various casings having different shapes made of different materials, for example, a casing which is partly opened and a casing which has no opening, namely, which is completely closed may be used. In this embodiment, the casing K which is completely closed and is rectangular-parallelepiped and is made of plastic is used as an example. The casing K has an attachment face 10 to which the bracket B1 is attached. In this embodiment, the casing K has one attachment face 10. The casing K may have two or more attachment faces 10.

The bracket B1 includes an attachment portion T to be attached to the front wheel house 2 and a rectangular plate-shaped insertion portion S1 to be inserted in a direction along the attachment face 10 of the casing K. The attachment portion T has an attachment hole 9 for a fastener to be secured to the front wheel house 2.

The casing K includes, on the attachment face 10, a pair of right and left guides 11, 11 into which the insertion portion S1 of the bracket B1 is inserted in a direction along the attachment face 10 and a fastening portion 12 which fastens the insertion portion S1 of the bracket B1 to the attachment face 10 of the casing K.

The pair of guides 11, 11 has a structure capable of selectively receiving any one of the bracket B1, a bracket B2 which includes an insertion portion S2 thicker and narrower in width than the insertion portion S1 of the bracket B1 and the same attachment portion T as that of the bracket B1, and a bracket B3 which includes an insertion portion S3 thicker and narrower in width than the insertion portion S2 of the bracket B2 and the same attachment portion T as that of the bracket B2. The attachment portions T are provided downward of the insertion portions S1, S2, and S3 of the brackets B1, B2, and B3 in an insertion direction, respectively. Each attachment portion T is narrower than the insertion portion S3 of the bracket B3 which is the narrowest insertion portion S3.

The insertion portions S1, S2, and S3 of the brackets B1, B2, and B3 have fastening holes 131, 132, and 133 to be engaged with the fastening portion 12 of the casing K, respectively. Each of the insertion portions S1, S2, and S3 of the brackets B1, B2, and B3 is inserted up to a stroke end in the guides 11, 11 of the casing K only while the fastening portion 12 of the casing K is engaged with the corresponding one of the fastening holes 131, 132, and 133 of the insertion portions S1, S2, and S3 of the brackets B1, B2, and B3. The fastening portion 12 has an inclined face 19 which faces the bracket B1, B2, or B3 before insertion and is gradually raised so as to smoothly receive the insertion portion S1, S2, or S3.

The pair of guides 11, 11 has an insertion port 14, defined by a left end 14L and a right end 14R, receiving the insertion portion S1 of the bracket B1 and two abutment portions 24 and 25 which abut against two corners 151 and 161 of the leading end of the insertion portion S1 in the insertion direction when the insertion portion S1 of the bracket B1 is inserted into the guides 11, 11. The abutment portions 24 and 25 have abutting faces 171 and 181, respectively. The left guide 11 guides the left side edge of the bracket B1 in the range between the left end 14L and the abutment portion 24 and the right guide 11 guides the right side edge of the bracket B1 in the range between the right end 14R and the abutment portion 25.

The right end 14R and the left end 14L, defining the insertion port 14, of the guides 11, 11 have a pair of grooves 20 which face each other and each of which is shaped to have steps varying in width such that the width is narrower as the step is farther away from the attachment face 10 of the casing K.

Figure 3:
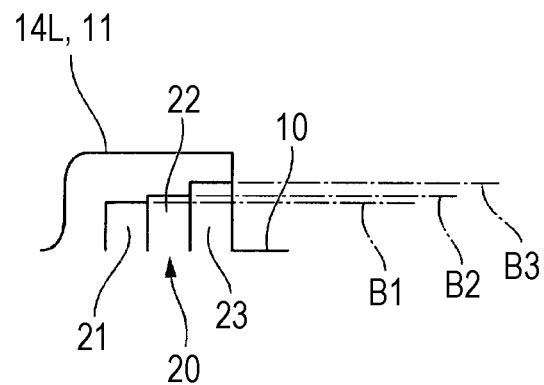
FIG. 3 is a plan view of the structure as viewed in the direction of an arrow III in FIG. 2.

Referring to FIG. 3, the groove 20 of the left end 14L includes a first guide groove segment 21, a second guide groove segment 22, and a third guide groove segment 23 such that the groove segments are arranged to form steps. The first guide groove segment 21, serving as the lowest step in the guide 11, is the outermost groove segment in the width direction of the groove 20 and guides the side edge of the insertion portion S1 of the bracket B1. The second guide groove segment 22 is placed inside the first guide groove segment 21 in the width direction of the groove 20 and is higher than the first guide groove segment 21 and guides the side edge of the insertion portion S2 of the bracket B2. The third guide groove segment 23 is placed inside the second guide groove segment 22 in the width direction of the groove 20 and is higher than the second guide groove segment 22 and guides the side edge of the insertion portion S3 of the bracket B3. The groove 20 of the right end 14R also has the same configuration.

Figure 4:
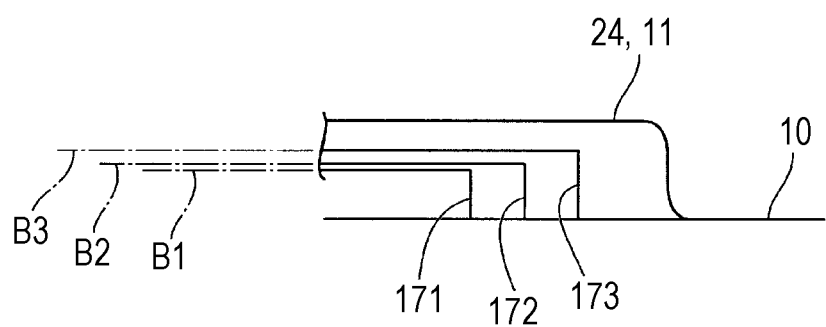
FIG. 4 is a plan view of the structure as viewed in the direction of an arrow IV in FIG. 2.

As illustrated in FIG. 4 which is an enlarged view of the abutment portion 24, the abutment portions 24 and 25 include abutting faces 172 and 182 related to the bracket B2, respectively, the two abutting faces 172 and 182 being to abut against two corners 152 and 162 of the leading end of the insertion portion S2 of the bracket B2 in the insertion direction, respectively, in a manner similar to the two abutting faces 171 and 181 related to the bracket B1. The abutment portions 24 and 25 further include abutting faces 173 and 183 related to the bracket B3, respectively, the two abutting faces 173 and 183 being to abut against two corners 153 and 163 of the leading end of the insertion portion S3 of the bracket B3 in the insertion direction, respectively.

The abutting faces 173 and 183, the abutting faces 172 and 182, and the abutting faces 171 and 181 are arranged in that order from the backs of the abutment portions 24 and 25 in the insertion direction of the insertion portions S1, S2, and S3 of the brackets B1, B2, and B3. The heights of the abutting faces 172 and 182 are higher than those of the abutting faces 171 and 181 and the heights of the abutting faces 173 and 183 are higher than those of the abutting faces 172 and 182 in association with the first guide groove segments 21, the second guide groove segments 22, and the third guide groove segments 23.

Accordingly, when the insertion portion S1 of the bracket B1 is inserted up to a stroke end defined by the first guide groove segments 21, the two corners 151 and 161 abut against the abutting faces 171 and 181 of the abutment portions 24 and 25, respectively. When the insertion portion S2 of the bracket B2 is inserted up to a stroke end defined by the second guide groove segments 22, the two corners 152 and 162 abut against the abutting faces 172 and 182 of the abutment portions 24 and 25, respectively. When the insertion portion S3 of the bracket B3 is inserted up to a stroke end defined by the third guide groove segments 23, the two corners 153 and 163 abut against the abutting faces 173 and 183 of the abutment portions 24 and 25, respectively.

Figure 5:
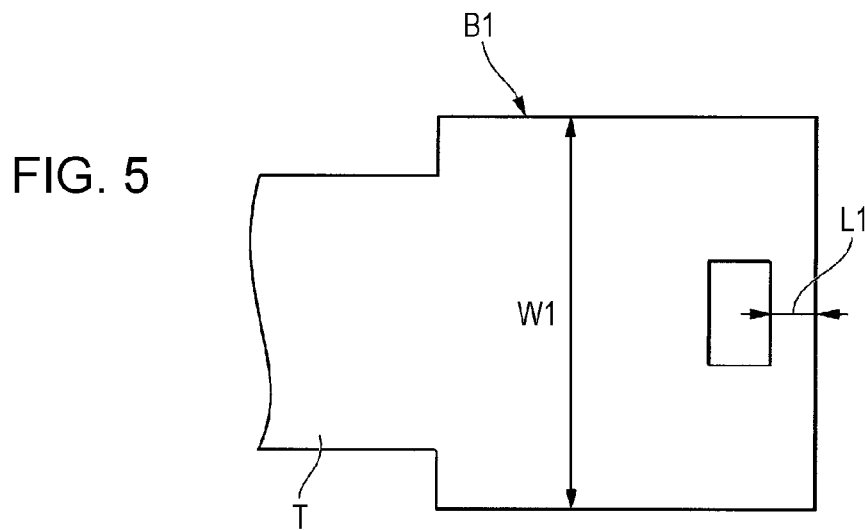
FIG. 5 is a diagram illustrating an insertion portion of a bracket in FIG. 2.
Figure 6:
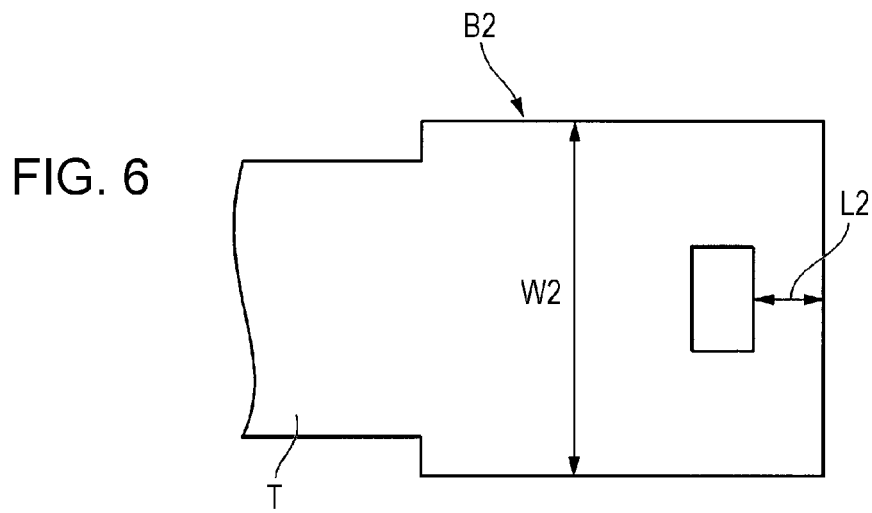
FIG. 6 is a diagram illustrating an insertion portion of another bracket in FIG. 2.
Figure 7:
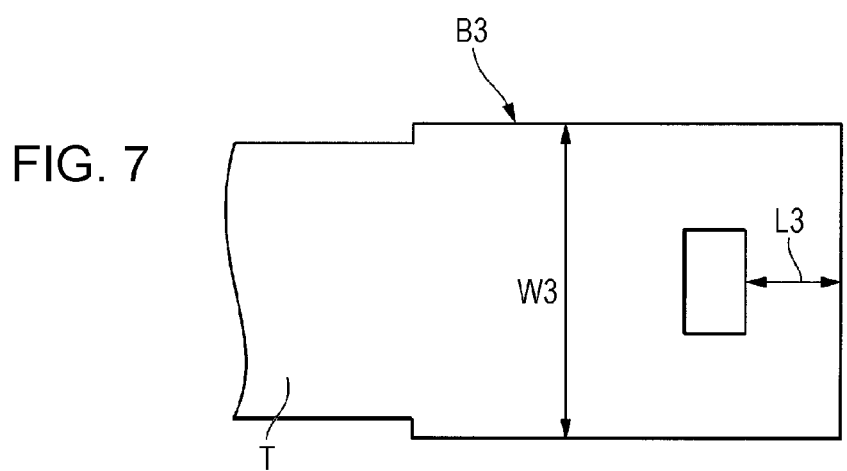
FIG. 7 is a diagram illustrating an insertion portion of another bracket in FIG. 2.

As illustrated in FIGS. 5 to 7, the insertion portions S1, S2, and S3 of the brackets B1, B2, and B3 vary in width such that the width W2 is narrower than the width W1 and the width W3 is narrower than the width W2. A distance L1 between the fastening hole 131 of the insertion portion S1 and the leading end thereof in the insertion direction, a distance L2 between the fastening hole 132 of the insertion portion S2 and the leading end thereof in the insertion direction, and a distance L3 between the fastening hole 133 of the insertion portion S3 and the leading end thereof in the insertion direction differ from one another such that the distance L2 is longer than the distance L1 and the distance L3 is longer than the distance L2. When any of the insertion portions S1, S2, and S3 of the brackets B1, B2, and B3 is inserted through the insertion port 14 of the casing K, therefore, the leading end of the insertion portion in the insertion direction abuts against the corresponding combination of the abutting faces 171 and 181, the abutting faces 172 and 182, and the abutting faces 173 and 183, so that the movement of the leading end is restricted in association with the corresponding one of the different widths W1, W2, and W3 of the insertion portions S1, S2, and S3 and the corresponding one of the distances L1, L2, and L3. Only while the leading end of the insertion portion S1, S2, or S3 of the bracket B1, B2, or B3 abuts against the abutting faces 171 and 181, the abutting faces 172 and 182, or the abutting faces 173 and 183 as described above, the fastening hole 131, 132, or 133 of the bracket B1, B2, or B3 is engaged with the fastening portion 12 of the casing K.

This embodiment has been described with respect to the case where the attachment portions T are placed downstream of the insertion portions S1, S2, and S3 of the brackets B1, B2, and B3 in the insertion direction. The attachment portions T may be placed upstream of the insertion portions S1, S2, and S3 of the brackets B1, B2, and B3 in the insertion direction such that each attachment portion T projects between the two abutment portions 24 and 25 after insertion (see indicated by alternate long and two short dashes lines in FIG. 2).

According to this embodiment, the three brackets B1, B2, and B3 can be used for the single casing K. It is therefore unnecessary to provide different casings K for the brackets B1, B2, and B3. The common casing K can be used. This results in a reduction in manufacturing.

Furthermore, the distances L1, L2, and L3 differ from one another in the insertion portions S1, S2, and S3 of the brackets B1, B2, and B3. Accordingly, even if an operator accidentally inserts any one of the insertion portions S1, S2, and S3 of the brackets B1, B2, and B3 along the non-corresponding combination of the first guide groove segments 21, the second guide groove segments 22, and the third guide groove segments 23, serving as the steps, of the guides 11, the fastening portion 12 is not engaged with the fastening hole 131, 132, or 133. Consequently, the operator can be allowed to recognize that the bracket is not inserted in a correct position.

Figure 8:
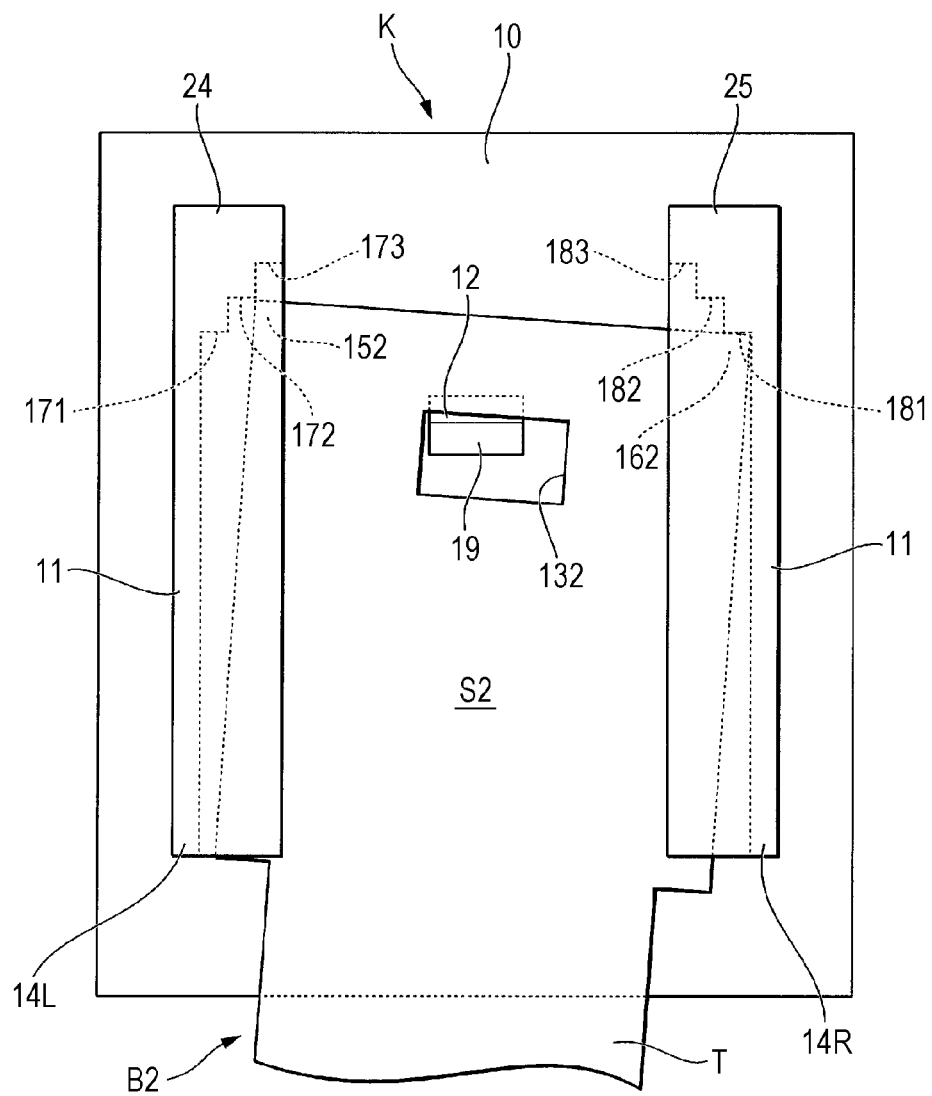
FIG. 8 is a plan view of the structure according to the first embodiment in a state where the bracket is partly inserted.

Referring to FIG. 8, generally, the insertion portion S2 of the bracket B2 cannot be inserted into the first guide groove segments 21 for the bracket B1 including the insertion portion S1 thinner than the insertion portion S2. If the insertion portion S2 of the bracket B2 is forced to be inserted through the insertion port 14 between the guides 11, 11 along the step such that the corner 162 of the insertion portion S2 abuts against the abutting face 181 of the guide 11 and the leading end of the insertion portion S2 is rotated to the right as illustrated in FIG. 8, the fastening portion 12 is not engaged with the fastening hole 132 and the right corner of the trailing end of the insertion portion S2 in the insertion direction projects from the guide 11. Advantageously, the operator can be allowed to immediately recognize such a mismatch that the bracket is not inserted in the correct position.

The two abutment portions 24 and 25, against which the corners 151 and 161, the corners 152 and 162, and the corners 153 and 163 of the leading ends of the insertion portions S1, S2, and S3 of the brackets B1, B2, and B3 in the insertion direction are to abut, respectively, are separated from each other, the attachment portions T, T, T, through which the brackets B1, B2, and B3 are to be attached to the rear wall 3 of the front wheel house 2, may be arranged either of downstream of the insertion portions S1, S2, and S3 of the brackets B1, B2, and B3 in the insertion direction and upstream thereof in the insertion direction such that each attachment portion projects between the abutment portions 24 and 25 after insertion. Accordingly, the attachment portion of each of the brackets B1, B2, and B3 to be attached to the rear wall 3 of the front wheel house 2 can be changed so as to extend from the bracket in the opposite direction. The casing K can be attached to the rear wall 3 of the front wheel house 2 in an appropriate position and orientation while space saving is achieved.

A second embodiment of the present invention will be described with reference to FIG. 1 and FIGS. 9 to 18. The same components as those in the first embodiment are designated by the same reference numerals.

Figure 9:
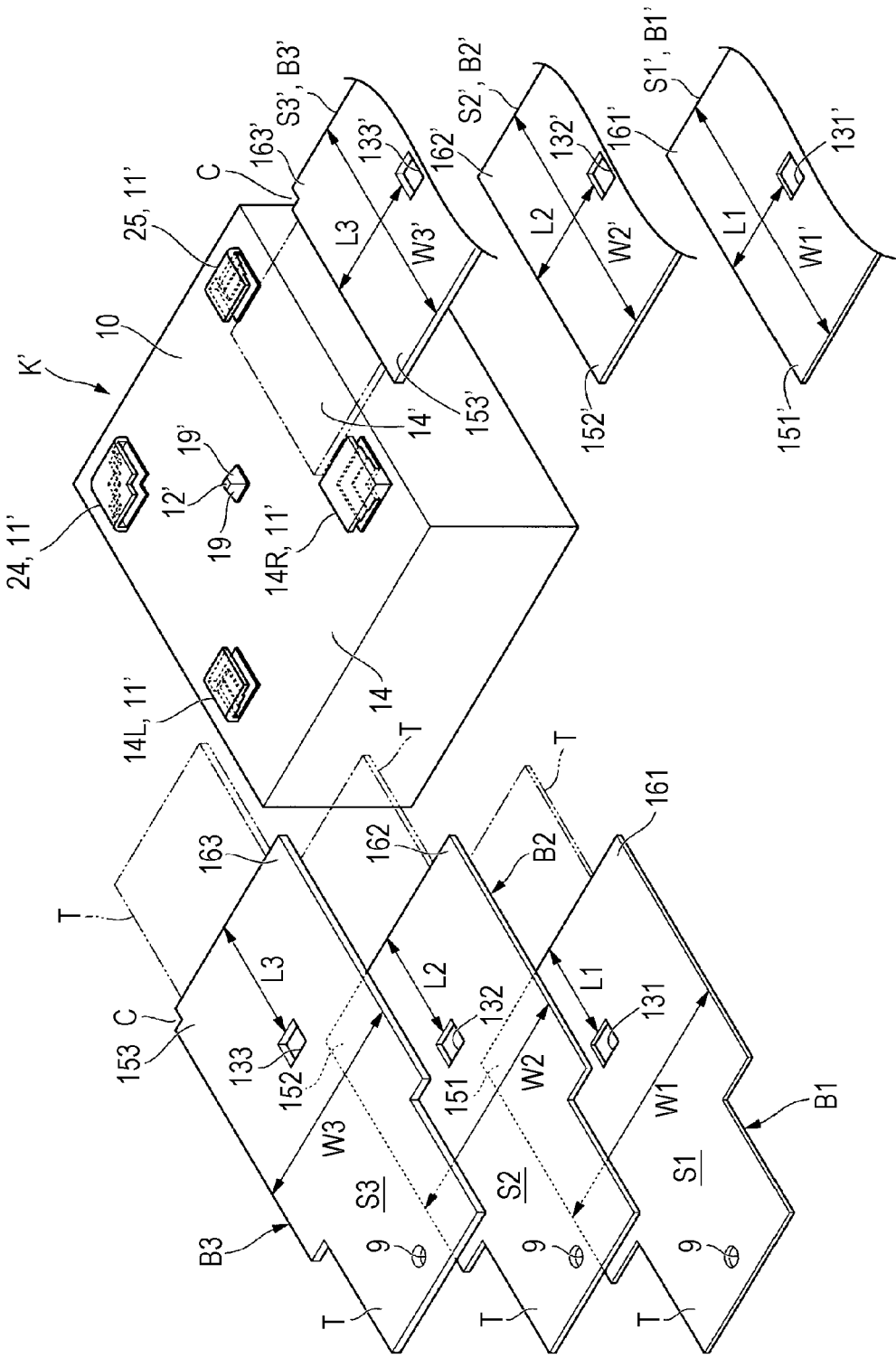
FIG. 9 is a schematic perspective view of a casing attachment structure according to a second embodiment of the present invention.

Referring to FIG. 9, a casing K' according to this embodiment includes guides 11' arranged such that the insertion port 14 in the first embodiment is spaced apart from the abutment portions 24 and 25. The guides 11' include the insertion port 14 through which any of the brackets B1, B2, and B3 is inserted and another insertion port 14' which is directed perpendicular to the insertion port 14 and is defined by the right end 14R of the insertion port 14 and the abutment portion 25 and through which any of brackets B1', B2', and B3' is inserted. When any of insertion portions S1', S2', and S3' of the brackets B1', B2', and B3' is inserted through the insertion port 14', the abutment portion 24 abuts against the corresponding one of corners 161', 162', and 163' of the insertion portions S1', S2', and S3'.

The relationship among the brackets B1', B2', and B3' is similar to that among the brackets B1, B2, and B3. The bracket B2' includes the insertion portion S2' thicker and narrower in width than the insertion portion S1' of the bracket B1'. The bracket B3' includes the insertion portion S3' thicker and narrower in width than the insertion portion S2' of the bracket B2'. The right corner 153 of the bracket B3 and a right corner 153' of the bracket B3' each have a right-angled notch C for providing a clearance in the abutment portion 24 (see FIG. 10). Attachment portions T are the same as those in the first embodiment.

The right end 14R and the left end 14L, which define the insertion port 14, and the abutment portions 24 and 25 positioned in the four corners of the casing K' are effectively used so that any of the brackets B1', B2', and B3' can be inserted through the insertion port 14' defined by the right end 14R and the abutment portion 25. The left end 14L defining the insertion port 14 and the abutment portion 24 are allowed to function as abutment members for the insertion portions S1', S2', and S3' of the brackets B1', B2', and B3'.

Figure 10:
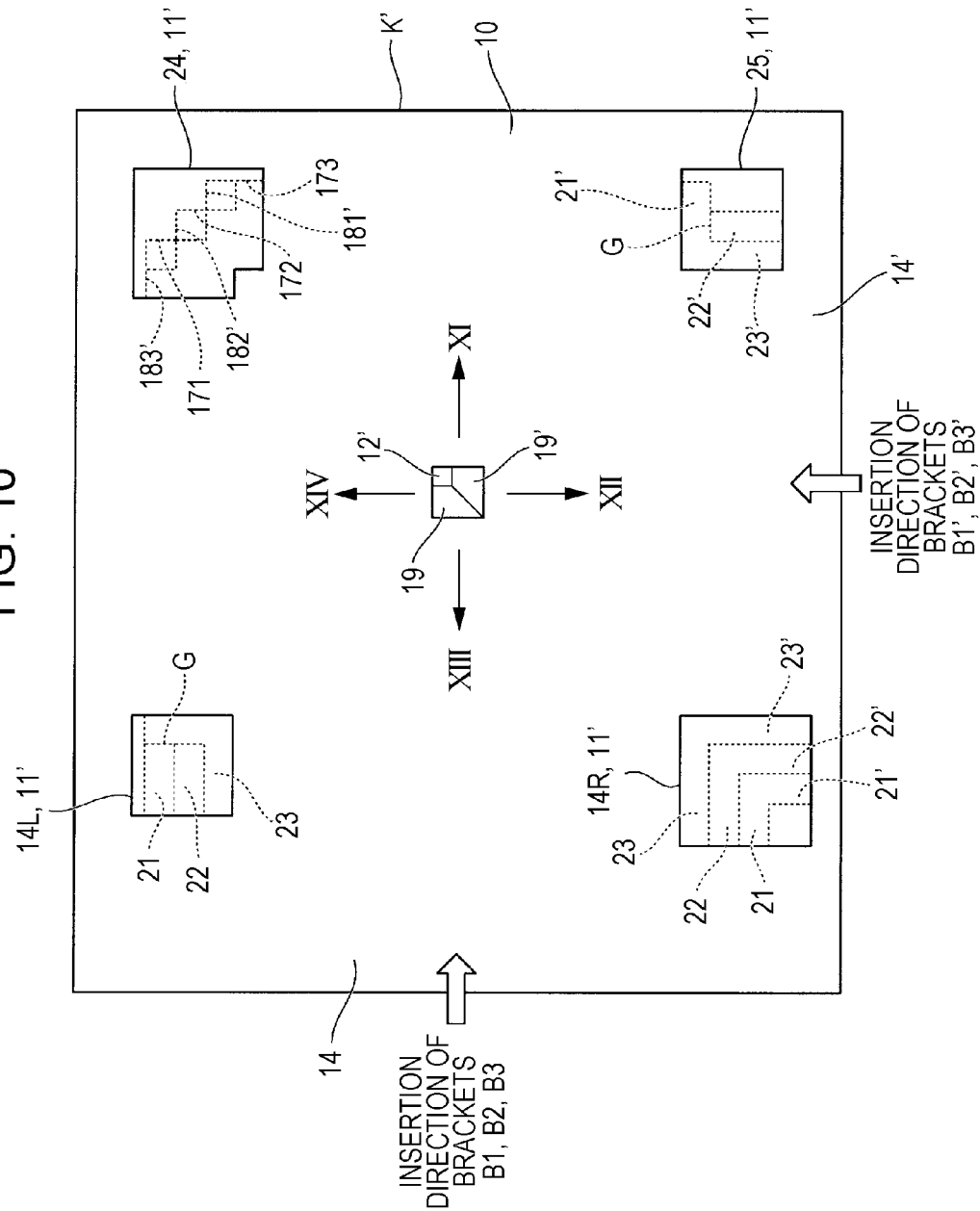
FIG. 10 is a plan view of a casing according to the second embodiment.
Figure 11:
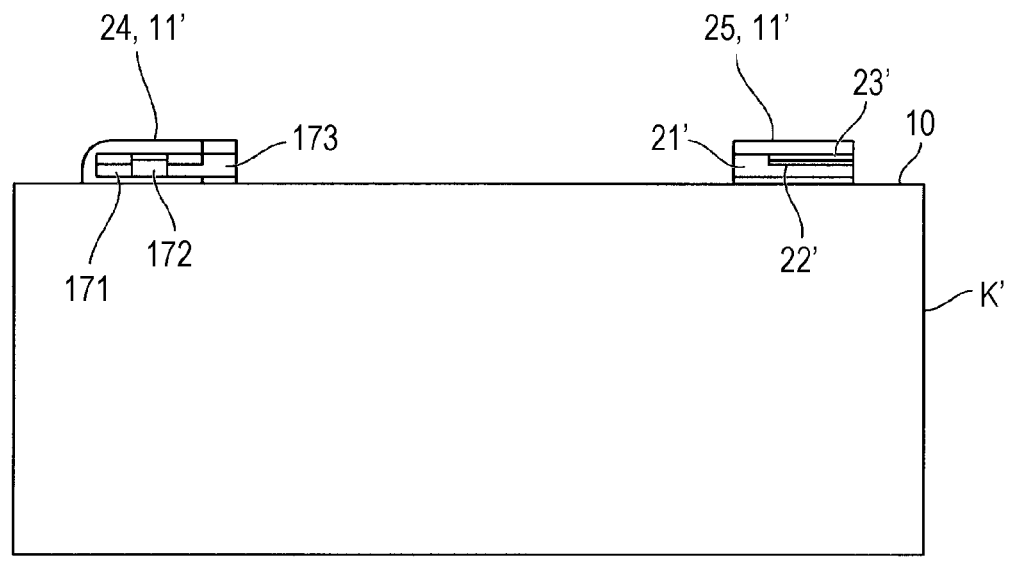
FIG. 11 is a plan view of the structure as viewed in the direction of an arrow XI in FIG. 10 and also schematically illustrates the casing.

As illustrated in FIGS. 10 and 11, therefore, the abutment portion 24 has the abutting faces 171, 172, and 173, against which the corners 151, 152, and 153 of the insertion portions S1, S2, and S3 are to abut, respectively, for the insertion of the brackets B1, B2, and B3 through the insertion port 14. The abutment portion 25 does not function as a member against which the corners 161, 162, and 163 of the insertion portions S1, S2, and S3 are to abut.

Figure 13:
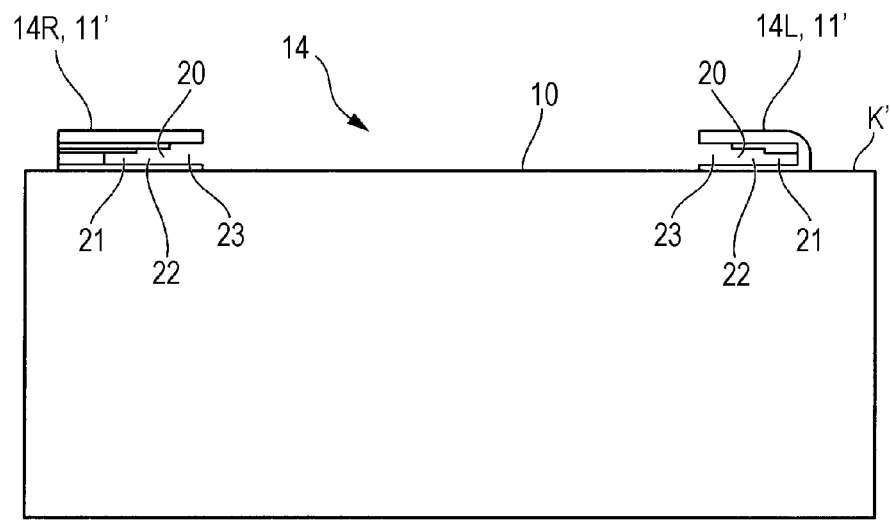
FIG. 13 is a plan view of the structure as viewed in the direction of an arrow XIII in FIG. 10 and also illustrates the casing.

As illustrated in FIGS. 10 and 13, the left end 14L and the right end 14R, defining the insertion port 14, each include the first guide groove segment 21, the second guide groove segment 22, and the third guide groove segment 23 constituting the groove 20 such that the segments are arranged to form steps in a manner similar to the first embodiment for the insertion of the brackets B1, B2, and B3 through the insertion port 14.

Specifically, the insertion port 14 is defined by the right end 14R and the left end 14L facing each other and including the pair of grooves 20 shaped so as to have steps varying in width such that the width is narrower as the step is farther away from the attachment face 10 of the casing K'. Each groove 20 includes the first guide groove segment 21 which serves as the lowest step in the guide 11' and is the outermost groove segment in the width direction of the groove 20 and guides the side edge of the insertion portion S1 of the bracket B1, the second guide groove segment 22 which is placed inside the first guide groove segment 21 in the width direction of the groove 20 and is higher than the first guide groove segment 21 and guides the side edge of the insertion portion S2 of the bracket B2, and the third guide groove segment 23 which is placed inside the second guide groove segment 22 in the width direction of the groove 20 and is higher than the second guide groove segment 22 and guides the side edge of the insertion portion S3 of the bracket B3. In the abutment portion 24, abutting faces 183', 182', and 181', which will be described later, function as guiding faces for guiding the side edges of the insertion portions S1, S2, and S3 in conjunction with the first guide groove segment 21, the second guide groove segment 22, and the third guide groove segment 23 of the left end 14L.

Figure 14:
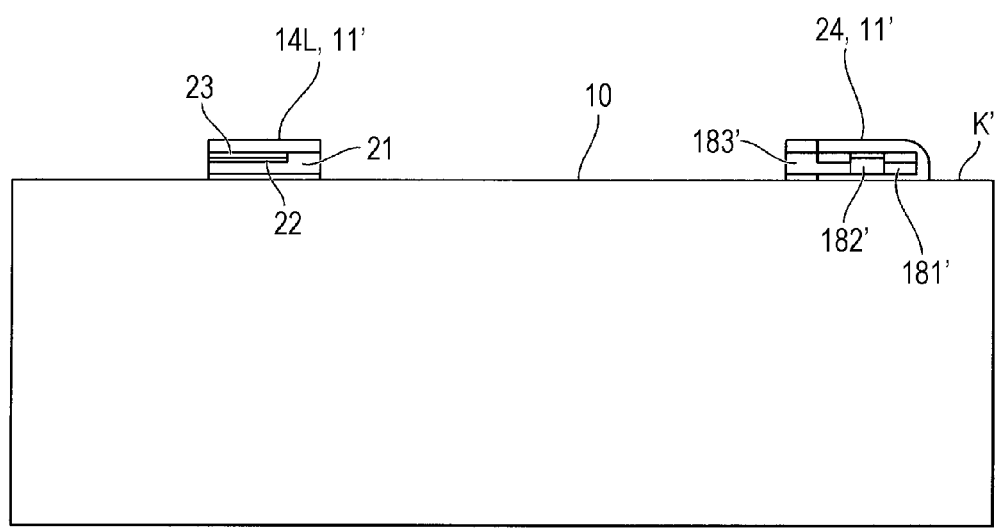
FIG. 14 is a plan view of the structure as viewed in the direction of an arrow XIV in FIG. 10 and also illustrates the casing.
Figure 15:
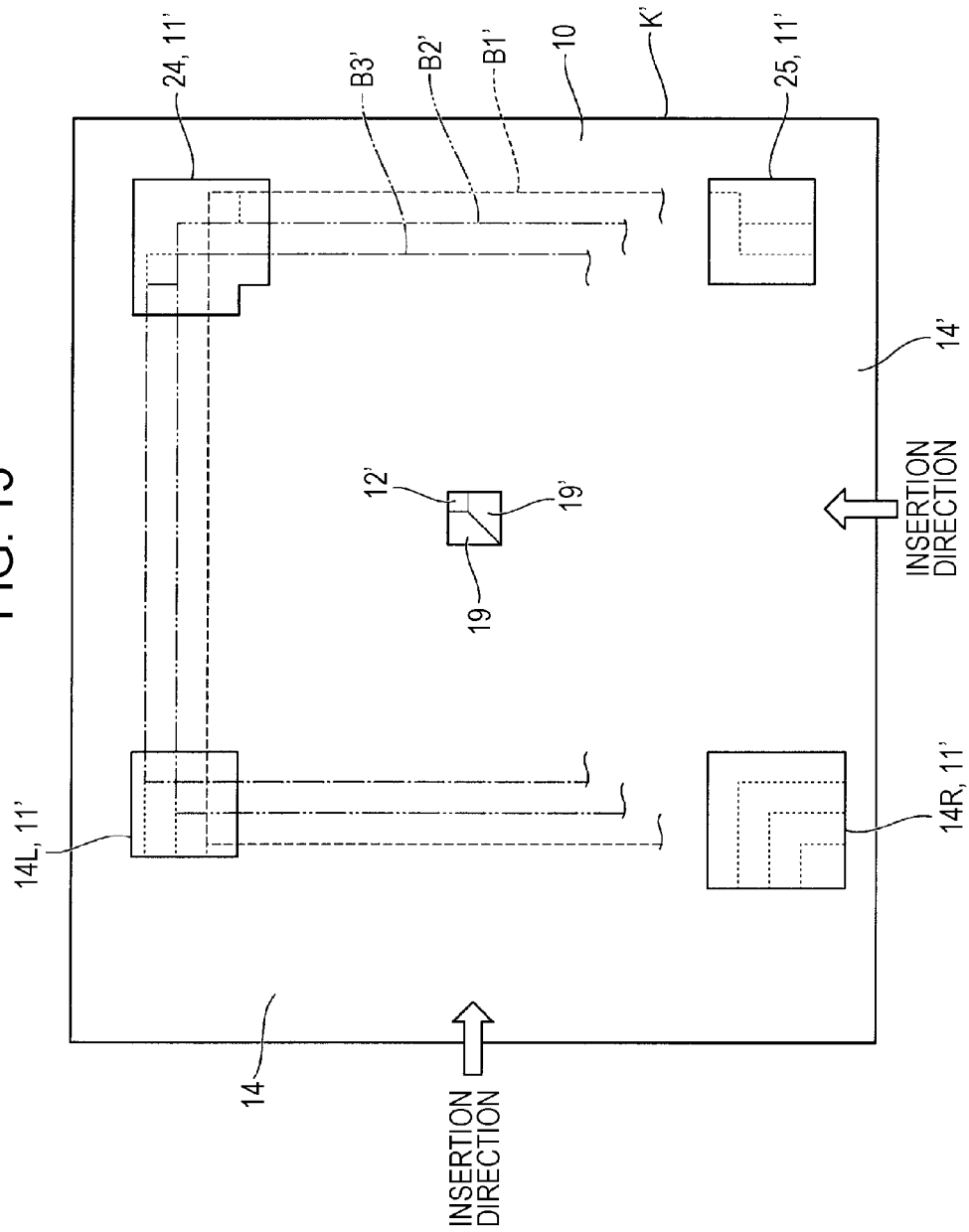
FIG. 15 is a plan view of the structure according to the second embodiment and illustrates bracket insertion positions.

As illustrated in FIGS. 10 and 14, the abutment portion 24 has the abutting faces 181', 182' and 183', against which the corners 161', 162', and 163' of the insertion portions S1', S2', and S3' are to abut, respectively, for the insertion of the brackets B1', B2', and B3' through the insertion port 14'. The left end 14L, defining the insertion port 14, does not function as a member against which corners 151', 152', and 153' of the insertion portions S1', S2', and S3' of the brackets B1', B2', and B3' are to abut.

Figure 12:
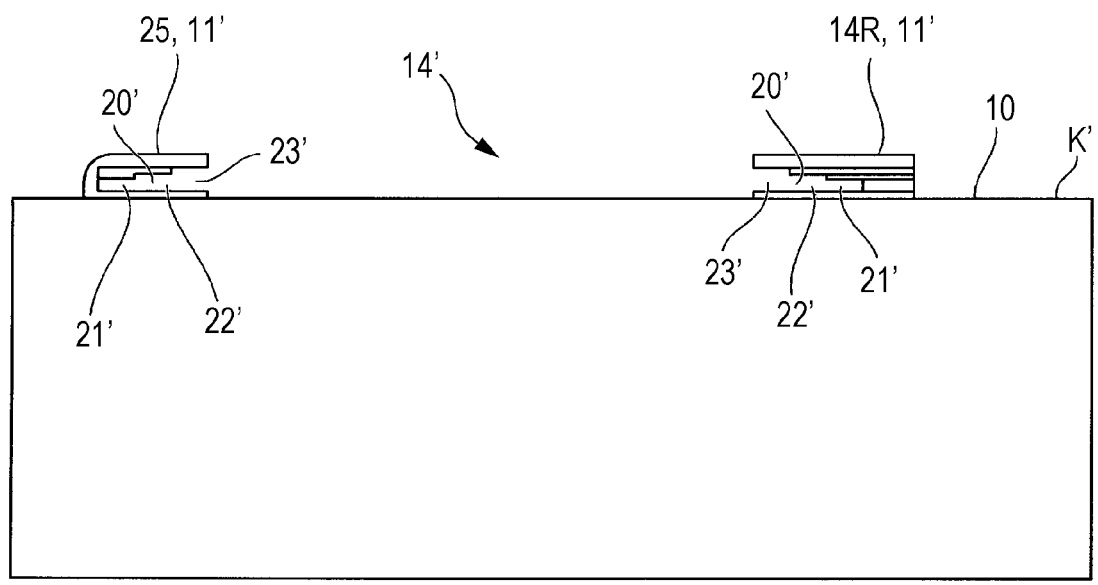
FIG. 12 is a plan view of the structure as viewed in the direction of an arrow XII in FIG. 10 and also illustrates the casing.

As illustrated in FIGS. 10 and 12, the right end 14R, defining the insertion port 14, has a first guide groove segment 21', a second guide groove segment 22', and a third guide groove segment 23' guiding the side edges of the insertion portions S1', S2', and S3' for the insertion of the brackets B1', B2', and B3' through the insertion port 14'. The abutment portion 25 also has a first guide groove segment 21', a second guide groove segment 22', and a third guide groove segment 23' guiding the side edges of the insertion portions S1', S2', and S3' in association with the right end 14R.

The above-described abutting faces 173, 172, and 171 of the abutment portion 24 function as guiding faces guiding the side edges of the insertion portions S1', S2', and S3' in conjunction with the first guide groove segment 21', the second guide groove segment 22', and the third guide groove segment 23' of the abutment portion 25.

Specifically, the other insertion port 14' is defined by the right end 14R and the abutment portion 25 facing each other and including a pair of grooves 20' shaped so as to have steps varying in width such that the width is narrower as the step is farther away from the attachment face 10 of the casing K'. Each groove 20' includes the first guide groove segment 21' which serves as the lowest step in the guide 11' and is the outermost groove segment in the width direction of the groove 20' and guides the side edge of the insertion portion S1' of the bracket B1', the second guide groove segment 22' which is placed inside the first guide groove segment 21' in the width direction of the groove 20' and is higher than the first guide groove segment 21' and guides the side edge of the insertion portion S2' of the bracket B2', and the third guide groove segment 23' which is placed inside the second guide groove segment 22' in the width direction of the groove 20' and is higher than the second guide groove segment 22' and guides the side edge of the insertion portion S3' of the bracket B3'.

Referring to FIG. 10, therefore, the right end 14R has the first guide groove segment 21, the second guide groove segment 22, and the third guide groove segment 23 for guiding the side edges of the insertion portions S1, S2, and S3 of the brackets B1, B2, and B3 inserted through the insertion port 14, respectively, and further has the first guide groove segment 21', the second guide groove segment 22', and the third guide groove segment 23' for guiding the side edges of the insertion portions S1', S2', and S3' of the brackets B1', B2', and B3' inserted through the insertion port 14', respectively.

Figure 16:
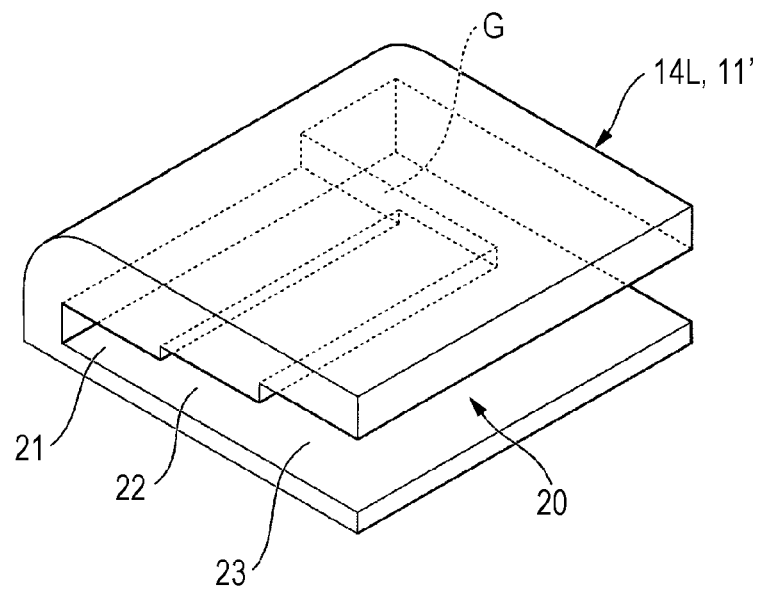
FIG. 16 is an enlarged perspective view of substantial part in the second embodiment.

Referring to FIG. 16, the left end 14L has the first guide groove segment 21, the second guide groove segment 22, and the third guide groove segment 23 for guiding the side edges of the insertion portions S1, S2, and S3 of the brackets B1, B2, and B3 inserted through the insertion port 14, respectively and further has a guiding face G (see FIG. 10) for guiding the side edge of the insertion portion S3' of the bracket B3' inserted through the insertion port 14'. The abutment portion 25, which is symmetrically opposite to the left end 14L, has a guiding face G for guiding the side edge of the insertion portion S3 of the bracket B3 inserted through the insertion port 14 (see FIG. 10).

Figure 17:
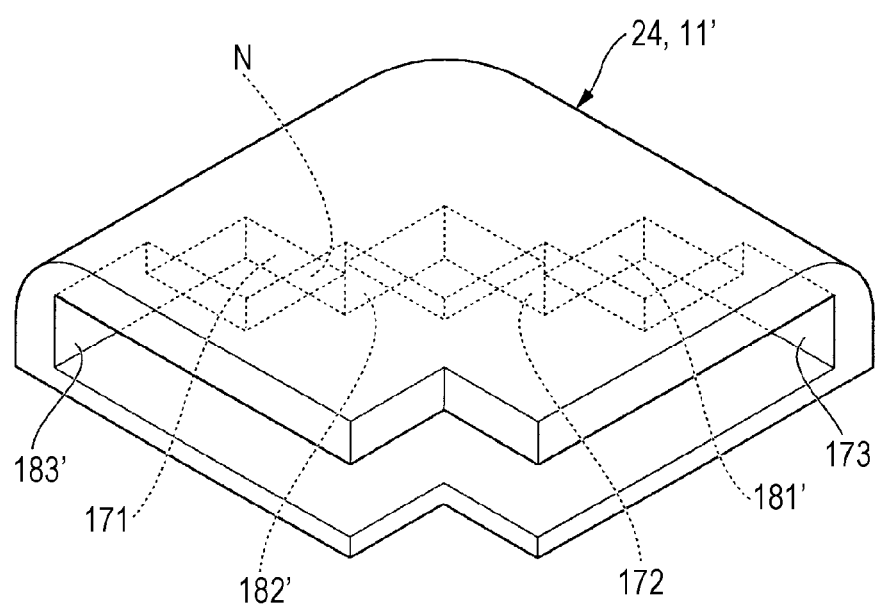
FIG. 17 is an enlarged perspective view of substantial part in the second embodiment.

Referring to FIG. 17, the abutment portion 24 has the abutting faces 173, 181', 172, 182', 171, and 183' arranged in that order from the back of the abutment portion 24 in the insertion direction of the brackets B1, B2, and B3 to the back thereof in the insertion direction of the brackets B1', B2', and B3' such that the abutting faces form steps, and further has a stepped notch receiving portion N for the notches C, C of the brackets B3, B3' such that the notch receiving portion N is an inverted pattern of the arrangement of the abutting faces 173, 181', 172, 182', 171, and 183' and is positioned adjacent to and on these abutting faces.

The attachment face 10 of the casing K' includes a fastening portion 12' to fasten any of the insertion portions S1, S2, and S3 of the brackets B1, B2, and B3 and the insertion portions S1', S2', and S3' of the brackets B1', B2', and B3'. The fastening portion 12' has the inclined face 19 which is gradually raised so as to smoothly receive any of the insertion portions S1, S2, and S3 of the brackets B1, B2, and B3 and further has an inclined face 19' which is gradually raised so as to smoothly receive any of the insertion portions S1', S2', and S3' of the brackets B1', B2', and B3'.

The insertion portions S1, S2, and S3 of the brackets B1, B2, and B3 have the fastening holes 131, 132, and 133 to be engaged with the fastening portion 12' of the casing K', respectively. Only while the fastening portion 12' of the casing K' is engaged with any of the fastening holes 131, 132, and 133 of the insertion portions S1, S2, and S3 of the brackets B1, B2, and B3, the corresponding one of the insertion portions S1, S2, and S3 of the brackets B1, B2, and B3 is inserted up to a stroke end in the guides 11' of the casing K'.

The insertion portions S1', S2', and S3' of the brackets B1', B2', and B3' have fastening holes 131', 132', and 133' to be engaged with the fastening portion 12' of the casing K', respectively. Only while the fastening portion 12' of the casing K' is engaged with any of the fastening holes 131', 132', and 133' of the insertion portions S1', S2', and S3' of the brackets B1', B2', and B3', the corresponding one of the insertion portions S1', S2', and S3' of the brackets B1', B2', and B3' is inserted up to a stroke end in the guides 11' of the casing K'. The dimensions, including the positions of the fastening holes 131', 132', and 133', of the insertion portions S1', S2', and S3' of the brackets B1', B2', and B3' are the same as those in the first embodiment (see FIG. 9).

According to this embodiment, the three brackets B1, B2, and B3 and the three brackets B1', B2', and B3' to be inserted perpendicular to the brackets B1, B2, and B3 can be used for the single casing K'. Six attachment patterns using the common casing K' are provided, thus achieving a reduction in cost.

As regards a distance L1' between the fastening hole 131' of the insertion portion S1' of the bracket B1' and the leading end thereof in the insertion direction, a distance L2' between the fastening hole 132' of the insertion portion S2' of the bracket B2' and the leading end thereof in the insertion direction, and a distance L3' between the fastening hole 133' of the insertion portion S3' of the bracket B3' and the leading end thereof in the insertion direction, the distances L1', L2', and L3' differ from one another in the insertion portions S1', S2', and S3' of the brackets B1, B2, and B3. Accordingly, even if an operator accidentally inserts any of the insertion portions S1', S2', and S3' of the brackets B1', B2', and B3' along the non-corresponding combination of the first guide groove segments 21', the second guide groove segments 22', and the third guide groove segments 23', serving as the steps, of the guides 11', the fastening portion 12' is not engaged with the fastening hole 131', 132', or 133'. Consequently, the operator can be allowed to recognize whether the bracket is inserted in a correct position. The same applies to the brackets B1, B2, and B3.

Referring to FIG. 18, generally, the insertion portion S2 of the bracket B2 cannot be inserted into the first guide groove segments 21 for the bracket B1 including the insertion portion S1 thinner than the insertion portion S2. If the insertion portion S2 of the bracket B2 is forced to be inserted through the insertion port 14 along the step such that the corner 152 of the insertion portion S2 abuts against the abutting face 171 of the abutment portion 24 of the guide 11' and the leading end of the insertion portion S2 is rotated to the left as illustrated in FIG. 18, the fastening portion 12' is not engaged with the fastening hole 132 and the left corner of the trailing end of the insertion portion S2 in the insertion direction projects from the guide 11'. Advantageously, the operator can be allowed to immediately recognize such a mismatch that the bracket is not inserted in the correct position. The same applies to the brackets B1, B3, B1', B2', and B3'.

The abutment portion 24, against which the corners 161', 162', and 163' of the leading ends of the insertion portions S1', S2', and S3' of the brackets B1', B2', and B3' in the insertion direction are to abut, is spaced apart from the left end 14L against which the corners 151', 152', and 153' of the leading ends of the insertion portions S1', S2', and S3' of the brackets B1', B2', and B3' in the insertion direction are to abut. As regards attachment portions through which the brackets B1', B2', and B3' are to be attached to the rear wall 3 of the front wheel house 2, therefore, the attachment portions T, T, T may be arranged either of downstream of the insertion portions S1', S2', and S3' of the brackets B1', B2', and B3' in the insertion direction and upstream thereof in the insertion direction such that each attachment portion projects between the abutment portion 24 and the left end 14L after insertion. Accordingly, the attachment portion T of each of the brackets B1', B2', and B3' to be attached to the rear wall 3 of the front wheel house 2 can be changed so as to extend from the bracket in the opposite direction. The casing K' can be attached to the rear wall 3 of the front wheel house 2 in an appropriate position and orientation while space saving is achieved.

In particular, according to the present embodiment, the insertion portions S1, S2, and S3 of the brackets B1, B2, and B3 and the insertion portions S1', S2', and S3' of the brackets B1', B2', and B3' can be inserted in two directions substantially perpendicular to each other. As a result, the attachment portion T of the bracket can be placed in any of four positions relative to the guides 11'. The casing K' can be attached to the front wheel house 2 in an appropriate position and orientation while space saving is achieved.

The present invention is not limited to the above-described embodiments. The structure in which any of the brackets B1, B2, and B3 and the brackets B1', B2', and B3' is attached has been described in the second embodiment. The present invention is also applicable to a case where the brackets B1, B2, and B3 and the brackets B1', B2', and B3' are the same brackets. In this case, although the position of the notch C of the bracket B3 differs from that of the bracket B3', the bracket may be reversed and used. In a case where the same bracket is used such that the bracket can be inserted through either of the insertion ports 14 and 14', the insertion portion of the bracket has to be a square and the fastening portion 12 has to be positioned at the intersection of diagonals.

As regards a vehicle portion to which the casing K or K' is attached, the front wheel house 2 has been described as an example. A vehicle portion to which the casing is attached is not limited and the present invention can be applied to anything other than a vehicle.

According to the embodiment of the present invention, a casing attachment structure includes a casing (for example, a casing K in an embodiment) having at least one attachment face (e.g., an attachment face 10 in the embodiment) and brackets (e.g., brackets B1, B2, and B3 in the embodiment) configured to mount the casing to a target (e.g., a front wheel house 2 in the embodiment), each bracket including an attachment portion (e.g., an attachment portion T in the embodiment) to be attached to the target and a rectangular plate-shaped insertion portion (e.g., insertion portions S1, S2, and S3 in the embodiment), the casing including, on the attachment face, a receiving member (e.g., guides 11 in the embodiment) into which any of the insertion portions of the brackets is inserted along the attachment face and a fastening portion (e.g., a fastening portion 12 in the embodiment) which fastens the insertion portion of the bracket to the attachment face of the casing, the insertion portion of each bracket including a fastening receiving portion (e.g., fastening holes 131, 132, and 133 in the embodiment) to be engaged with the fastening portion of the casing, the fastening receiving portion being engaged with the fastening portion to fasten the insertion portion of the bracket to the receiving member of the casing. In this structure, the receiving member of the casing includes an insertion port (e.g., an insertion port 14 in the embodiment) through which any of the insertion portions of the brackets is received and first and second abutment portions (e.g., abutment portions 24 and 25 in the embodiment) against which two corners (e.g., corners 151 and 161, corners 152 and 162, or corners 153 and 163 in the embodiment) of the leading end of the insertion portion in an insertion direction abut upon insertion of the insertion portion of the bracket. The insertion port is shaped so as to have steps varying in width such that the width is narrower as the step is farther away from the attachment face of the casing. Each abutment portion has such an inner shape that when any of the insertion portions is inserted through the insertion port, the abutment portion abuts against the leading end of the insertion portion in the insertion direction to restrict the movement of the leading end in association with the corresponding one of different widths (e.g., widths W1, W2, and W3 in the embodiment) of the insertion portions and the corresponding one of different distances (e.g., distances L1, L2, and L3 in the embodiment) each of which is between the fastening receiving portion and the leading end of the insertion portion. When any of the insertion portions of the brackets is inserted through the insertion port of the casing, the fastening receiving portion of the bracket is engaged with the fastening portion of the casing only while the leading end of the insertion portion in the insertion direction abuts against the abutment portions.

According to this embodiment, the plurality of brackets can be used for the single casing. If a bracket to be used varies depending on a target, it is unnecessary to prepare different casings for the individual brackets. This results in a reduction in manufacturing cost.

The distance between the fastening receiving portion of the insertion portion and the leading end of the insertion portion in the insertion direction varies from bracket to bracket. Even if any of the insertion portions of the brackets is accidentally inserted along the non-corresponding one of steps of the receiving member, therefore, the fastening portion is not engaged with the fastening receiving portion. Advantageously, an operator can be allowed to recognize whether the bracket is inserted in a correct position.

Furthermore, since the two abutment portions are provided, the attachment portion of each bracket to be attached to the target may be placed not only downstream of the insertion portion of the bracket in the insertion direction but also upstream thereof such that the attachment portion projects between the two abutment portions after insertion. Accordingly, the attachment portion of each bracket to be attached to the target can be changed so as to extend from the bracket in the opposite direction. Advantageously, the casing can be attached to the target in an appropriate position and orientation while space saving is achieved.

In this embodiment, the insertion port may be spaced apart from the first and second abutment portions in the casing. The receiving member (e.g., guides 11' in another embodiment) of the casing (e.g., a casing K' in the embodiment) may include a second insertion port (e.g., an insertion port 14' in the embodiment), directed substantially perpendicular to the insertion port (e.g., the insertion port 14 in the embodiment), including one end (e.g., a right end 14R in the embodiment) of the insertion port and the first abutment portion (e.g., the abutment portion 25 in the embodiment), and the second abutment portion (e.g., the abutment portion 24 in the embodiment) against which one corner (e.g., any of corners 151', 152', and 153' in the embodiment) of any of the insertion portions of the brackets abuts when the insertion portion is inserted through the second insertion port. The second insertion port may be shaped so as to have steps varying in width such that the width is narrower as the step is farther away from the attachment face of the casing. The other end of the insertion port and the second abutment portion may be shaped such that when any of the insertion portions of the brackets is inserted through the second insertion port of the casing, the other end and the second abutment portion abut against the leading end of the insertion portion in the insertion direction in association with the corresponding one of different widths (e.g., widths W1', W2', and W3' in the embodiment) of the insertion portions and the corresponding one of different distances (e.g., distances L1', L2', and L3' in the embodiment) each of which is between the fastening receiving portion and the leading end of the insertion portion. When any of the insertion portions of the brackets is inserted through the insertion port or the second insertion port in the casing, the fastening receiving portion of the bracket may be engaged with the fastening portion of the casing only while the leading end of the insertion portion in the insertion direction abuts against the second abutment portion.

Since the insertion portions of the brackets can be inserted into the receiving member in two directions substantially perpendicular to each other, the attachment portion of the bracket can be placed in any of four positions relative to the receiving member. Advantageously, the casing can be attached to the target in an appropriate position and orientation while space saving is achieved.

Obviously, numerous modifications and variations of the present invention are possible in light of the above teachings. It is therefore to be understood that within the scope of the appended claims, the invention may be practiced otherwise than as specifically described herein.

What is claimed is:

1. A casing attachment structure comprising:
   a casing having at least one attachment face;
   brackets to mount the casing to a body, each of the brackets comprising:
      an attachment portion to be attached to the body; and
      a rectangular plate-shaped insertion portion;
   the casing comprising:
      a receiving member which is provided on the at least one attachment face and into which the insertion portion of each of the brackets is to be inserted along the at least one attachment face; and
      a fastening portion to fasten the insertion portion to the at least one attachment face of the casing;
   the insertion portion of each of the brackets including a fastening receiving portion to be engaged with the fastening portion of the casing to fasten the insertion portion to the receiving member of the casing;
   the receiving member of the casing comprising:
      an insertion port through which the insertion portion of each of the brackets enters, the insertion port being shaped to have at least one step varying in a width of the insertion port such that the width is narrower as the at least one step is farther away from the at least one attachment face of the casing; and
      first and second abutment portions against which two corners of a leading end of the insertion portion in an insertion direction abut upon insertion of the insertion portion, each of the first and second abutment portions having such an inner shape that, when the insertion portion is inserted through the insertion port, the abutment portion abuts against the leading end of the insertion portion in the insertion direction to restrict a movement of the leading end in association with the corresponding one of different widths of the insertion portions and the corresponding one of different distances each of which is between the fastening receiving portion and the leading end of the insertion portion; and
   when the insertion portion of each of the brackets is inserted through the insertion port of the casing, the fastening receiving portion being to be engaged with the fastening portion of the casing only while the leading end of the insertion portion in the insertion direction abuts against the abutment portions,
   wherein
   the insertion port is spaced apart from the first and second abutment portions in the casing,
   the receiving member of the casing comprises
      a second insertion port directed substantially perpendicular to the insertion port, and including one end of the insertion port and the first abutment portion, and
      the second abutment portion to abut against one corner of the insertion portion of each of the brackets when the insertion portion is inserted through the second insertion port,
   the second insertion port is shaped to have steps varying in width such that the width is narrower as the step is farther away from the attachment face of the casing, the other end of the insertion port and the second abutment portion are shaped to abut against the leading end of the insertion portion in the insertion direction in association with the corresponding one of different widths of the insertion portions and the corresponding one of different distances each of which is between the fastening receiving portion and the leading end of the insertion portion when the insertion portion of each of the brackets is inserted through the second insertion port of the casing, and when the insertion portion of each of the brackets is inserted through the insertion port or the second insertion port in the casing, the fastening receiving portion of the bracket is engaged with the fastening portion of the casing only while the leading end of the insertion portion in the insertion direction abuts against the second abutment portion.

2. The casing attachment structure according to claim 1, wherein at least one bracket of the brackets has a notch at a corner of the insertion portion of the at least one bracket, the corner of the insertion portion abutting against the second abutment portion.

3. A casing attachment structure comprises:
a casing having at least one attachment face;
brackets to mount the casing to a body, each of the brackets comprising:
  an attachment portion to be attached to the body; and
  a rectangular plate-shaped insertion portion;
the casing comprising:
  a receiving member which is provided on the at least one attachment face and into which the insertion portion of each of the brackets is to be inserted along the at least one attachment face; and
  a fastening portion to fasten the insertion portion to the at least one attachment face of the casing;
the insertion portion of each of the brackets including a fastening receiving portion in a shape of a hole extending through the insertion portion to be engaged with the fastening portion of the casing to fasten the insertion portion to the receiving member of the casing;
the receiving member of the casing comprising:
  an insertion port through which the insertion portion of each of the brackets enters, the insertion port being shaped to have at least one step varying in a width of the insertion port such that the width is narrower as the at least one step is farther away from the at least one attachment face of the casing; and
  first and second abutment portions against which two corners of a leading end of the insertion portion in an insertion direction abut upon insertion of the insertion portion, each of the first and second abutment portions having such an inner shape that, when the insertion portion is inserted through the insertion port, the abutment portion abuts against the leading end of the insertion portion in the insertion direction to restrict a movement of the leading end in association with the corresponding one of different widths of the insertion portions and the corresponding one of different distances each of which is between the fastening receiving portion and the leading end of the insertion portion;

when the insertion portion of each of the brackets is inserted through the insertion port of the casing, the fastening receiving portion being to be engaged with the fastening portion of the casing only while the leading end of the insertion portion in the insertion direction abuts against the abutment portions; and a first guide provided on the attachment face and having a first stepped groove, and a second guide provided on the attachment face and having a second stepped groove, the first and second guides being configured to receive opposite edges of the insertion portion of the bracket as the bracket is inserted therein along the attachment face, the first and second stepped grooves each having a first step provided at a first width from one another and a first height from the attachment face to the first steps, the first and second stepped grooves each having a second step provided at a second width from one another and a second height from the attachment face to the second steps, the first width being larger than the second width, the first height being smaller than the second height.

4. The casing attachment structure according to claim 3, wherein
the insertion port is spaced apart from the first and second abutment portions in the casing,
the receiving member of the casing comprises
  a second insertion port directed substantially perpendicular to the insertion port, and including one end of the insertion port and the first abutment portion, and
  the second abutment portion to abut against one corner of the insertion portion of each of the brackets when the insertion portion is inserted through the second insertion port,
the second insertion port is shaped to have steps varying in width such that the width is narrower as the step is farther away from the attachment face of the casing,
the other end of the insertion port and the second abutment portion are shaped to abut against the leading end of the insertion portion in the insertion direction in association with the corresponding one of different widths of the insertion portions and the corresponding one of different distances each of which is between the fastening receiving portion and the leading end of the insertion portion when the insertion portion of each of the brackets is inserted through the second insertion port of the casing, and when the insertion portion of each of the brackets is inserted through the insertion port or the second insertion port in the casing, the fastening receiving portion of the bracket is engaged with the fastening portion of the casing only while the leading end of the insertion portion in the insertion direction abuts against the second abutment portion.

5. The casing attachment structure according to claim 4, wherein at least one bracket of the brackets has a notch at a corner of the insertion portion of the at least one bracket, the corner of the insertion portion abutting against the second abutment portion.

* * * * *